(12) United States Patent
Chong et al.

(10) Patent No.: US 6,624,489 B2
(45) Date of Patent: Sep. 23, 2003

(54) FORMATION OF SILICIDED SHALLOW JUNCTIONS USING IMPLANT THROUGH METAL TECHNOLOGY AND LASER ANNEALING PROCESS

(75) Inventors: Yung Fu Chong, Singapore (SG); Kin Leong Pey, Singapore (SG); Alex See, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/033,284

(22) Filed: Dec. 31, 2001

(65) Prior Publication Data

US 2002/0098689 A1 Jul. 25, 2002

Related U.S. Application Data

(62) Division of application No. 09/609,751, filed on Jul. 3, 2000, now Pat. No. 6,365,446.

(51) Int. Cl.[7] .................... H01L 29/76; H01L 21/3205; H01L 21/336
(52) U.S. Cl. .................. 257/413; 257/412; 257/288; 438/592; 438/197

(58) Field of Search .......................................... 438/592

(56) References Cited

U.S. PATENT DOCUMENTS

| 5,405,806 A | 4/1995 | Pfiester et al. ............ 437/200 |
| 5,432,129 A | 7/1995 | Hodges ....................... 437/200 |
| 5,624,867 A | 4/1997 | Cheng et al. ............... 438/560 |
| 5,861,340 A * | 1/1999 | Bai et al. |
| 5,888,888 A | 3/1999 | Talwar et al. ............... 438/533 |
| 5,953,615 A | 9/1999 | Yu .............................. 438/303 |
| 5,981,372 A | 11/1999 | Goto et al. ................. 438/621 |
| 6,365,446 B1 * | 4/2002 | Chong et al. |

* cited by examiner

Primary Examiner—John F. Niebling
Assistant Examiner—Stanetta Isaac
(74) Attorney, Agent, or Firm—George O. Saile; Rosemary L. S. Pike

(57) ABSTRACT

A method for producing MOS type transistors with deep source/drain junctions and thin, silicided contacts with desireable interfacial and electrical properties. The devices are produced by a method that involves pre-amorphization of the gate, source and drain regions by ion-implantation, the formation of a metal layer, ion implantation through the metal layer, the formation of a capping layer and a subsequent laser anneal.

6 Claims, 4 Drawing Sheets

FORMATION OF SILICIDED SHALLOW JUNCTIONS USING IMPLANT THROUGH METAL TECHNOLOGY AND LASER ANNEALING PROCESS

This is a division of patent application Ser. No. 09/609,751, filing date Jul. 3, 2000, now U.S. Pat. No. 6,365,446 Formation Of Salicided Ultra Shallow Junctions Using Implant Through Metal Technology And Laser Anenealing Process, assigned to the same assignee as the present invention.

BACKGROUND OF THE INVENTION

1. Field of the Invention

This invention relates to the fabrication of a semiconductor device. In particular, it relates to a method of making local electrical connections to such a device.

2. Description of the Related Art

As the size of microelectronic integrated semiconductor devices is increasingly reduced, the contact resistance between metallic interconnects and silicon devices becomes a relatively greater portion of the overall circuit resistance and plays a more important role in establishing its properties. As a result, decreasing contact resistance can materially enhance the device performance and reliability. A variety of approaches have been tried in order to alleviate the problems caused by relatively high contact resistance. One such approach is the salicide (self-aligned silicide) method, wherein various suicides (metal-silicon compounds having low contact resistance with silicon) are formed on the source, drain and gate electrode regions of silicon devices as part of the fabrication process of the device. For example, the suicides may be formed on the gate electrode and over the source and drain regions, immediately after the formation of the polysilicon sidewall spacers defining the gate electrode, by the deposition of various metallic species in such a fashion that the spacers themselves serve to properly align the suicide with the device. The utility of this process depends critically on the efficiency of the fabrication scheme as well as the quality of the contacts that are achieved. Needless to say, several methods have been advanced. Pfiester et al. (U.S. Pat. No. 5,405,806) teach a method for forming a metal silicide interconnect that involves the formation of a sacrificial material, such as silicon nitride, titanium nitride or tantalum nitride, which is then etched away to define a region within which the silicide is formed. Hodges (U.S. Pat. No. 5,432,129) teaches a method by which silicides such as titanium, cobalt or molybdenum are used to form a low contact resistance junction between two different silicon conductivity types, such as a p-n junction, in an integrated circuit requiring interconnects between a variety of polycrystalline silicon types. Talwar et al. (U.S. Pat. No. 5,888,888) teaches a method of forming a silicide contact region wherein an amorphous region is first formed in the silicon by ion implantation, subsequent to which a metal is made to diffuse into that region by laser irradiation. Following these processes, the region is converted to a more crystalline form by a rapid thermal annealing (RTA) process. The method of Talwar does not include the formation of a capping layer prior to the laser irradiation. However, the use of a capping layer is a novel and important part of the present invention. It plays two roles: 1. it protects the metal layer during laser annealing, thereby insuring a high quality silicide with good interfacial characteristics; 2. it permits a more careful regulation of the energy deposition produced by the laser annealing process, thereby assuring precise depth control of the underlying junction. Yu (U.S. Pat. No. 5,953,615) teaches a method of fabricating a MOSFET with deep source/drain junctions and shallow source/drain extensions. The deep junction formation is accomplished by the use of a first step which creates an amorphous region by ion implantation (the "pre-amorphizing" step), which has the additional advantage of allowing easier formation of silicide contacts. The method of Yu utilizes a barrier oxide that is deposited prior to the metal layer and, thereby, does not serve the same advantageous purposes as the capping layer provided by the method of the present invention. Goto et al. (U.S. Pat. No. 5,981,372) addresses the problem of removing unwanted films that remain after the formation of a silicide. For example, the formation of a titanium silicide (TiSi) also produces a layer of titanium nitride (TiN), which must be removed by various etching processes that can damage device surfaces. The method of Goto et al. teaches the formation of a conducting metal film over the metal remaining from the silicide formation. In this way, the silicide layer is protected by the silicide formation metal, allowing subsequent cleansing processes that will not damage the silicide. Thus, the method of Goto in effect uses a metal capping layer to protect a surface from cleansing processes, which is not the role of the capping layer in the present invention. Additionally, according to the practice of the method of Goto, but unlike the practice of the method of the present invention, said capping layer is allowed to remain. The method of Goto, cited above, also differs materially from the present invention in that it does not make use of ITM or laser annealing. Cheng et al. (U.S. Pat. No. 5,624,867) teach a method for forming palladium silicided shallow junctions using implant through metal/silicide technology. Ions are implanted into a palladium or palladium silicide layer over a silicon substrate. The impurities are driven into the silicon substrate during the formation or recrystallization of the palladium silicide layer and a diffusion region with a shallow junction is formed in the substrate. Laser annealing is not employed in this method to form the silicides or to drive the impurities into the silicon substrate.

As will be seen from the discussion above, the formation of silicided contact regions by methods such as the salicide method typically involve process steps such as pre-amorphizing implants (PAI) (Talwar et al.; Yu), rapid thermal annealing (RTA) using lasers or other means (Talwar et al.; Yu; Pfeister et al.; Hodges) and/or implant through metal (ITM) schemes (Cheng et al.). Rapid thermal annealing, however, produces suicides with poor uniformity and high interfacial roughness at the silicide-silicon interface. In addition, during the formation of suicides by rapid thermal annealing (RTA) there is a tendency to consume the entire junction as junction depths decrease to less than 100 nanometers, thus depleting the dopants at the junctions. These adverse effects render the junction more vulnerable to leakage and cause high contact resistance. These problems still exist with the use of a pre-amorphizing implant (PAI) or an implant through metal (ITM) scheme. Conventional ITM schemes involve the implantation of dopant ions into the metal/silicide layer, followed by a drive-in step to form shallow junctions. One issue in such ITM schemes is the confinement of dopants in the metal/silicide during the drive-in step.

SUMMARY OF THE INVENTION

The present invention addresses the problems associated with the silicidation process as practiced in the current art and as discussed above. Accordingly, it is an object of the present invention to provide a microelectronics device and a method for its fabrication, with such device having silicided contacts and superior dopant activation and dopant profile control. It is another object of the present invention to provide a method for fabricating a microelectronics device having abrupt, shallow junctions together with suicides with desired interfacial and electrical properties. These objects will be achieved through the use of ITM (implant-through-metal) and laser technology. The dopant profile can be controlled by rendering the silicon substrate amorphous to a desired depth by ion implantation so that the depth subsequently melted by the laser irradiation corresponds to the final junction depth. The extremely high ramp-up and ramp-down rate of laser annealing makes it suitable for the formation of abrupt, shallow junctions and silicides with desired interfacial and electrical properties. The laser fluence is chosen so that it is just sufficient to melt the amorphous silicon layer beneath the metal. The silicon atoms then diffuse/mix with the metal atoms to form suicides. During laser irradiation, dopant atoms are redistributed to the melt front almost instantaneously. At the same time, the silicon atoms and metal atoms are reacting at the metal-Si interface. The amorphous silicon layer then re-crystallizes from the underlying substrate at a high re-growth velocity such that the metal atoms do not diffuse through the entire depth of the melt. In this way, shallow junctions and suicides can be formed simultaneously. Hence, the shallow junction will not be completely consumed by the silicide formation.

BRIEF DESCRIPTION OF THE DRAWINGS

FIG. 1 shows a schematic cross-sectional view of a gate stack.

FIG. 2 shows the fabrication of FIG. 1 being subjected to ion implantation.

FIG. 3 shows the fabrication of FIG. 2 subsequent to an annealing process.

FIG. 4 shows the fabrication of FIG. 3 subsequent to deposition of a dielectric layer.

FIG. 5 shows the fabrication of FIG. 4 subsequent to an anisotropic etch.

FIG. 6 shows the fabrication of FIG. 5 subsequent to ion implantation and amorphization.

FIG. 7 shows the fabrication of FIG. 6 subsequent to deposition of a metal layer.

FIG. 8 shows the fabrication of FIG. 7 undergoing an ion implantation through the metal layer.

FIG. 9 shows the fabrication of FIG. 8 subsequent to the deposition of a capping layer.

FIG. 10 shows the fabrication of FIG. 9 undergoing laser irradiation at selected wavelengths.

FIG. 11 shows the completed fabrication subsequent to removal of the capping layer and unreacted metal layer.

DESCRIPTION OF THE PREFERRED EMBODIMENT

Figure 1:
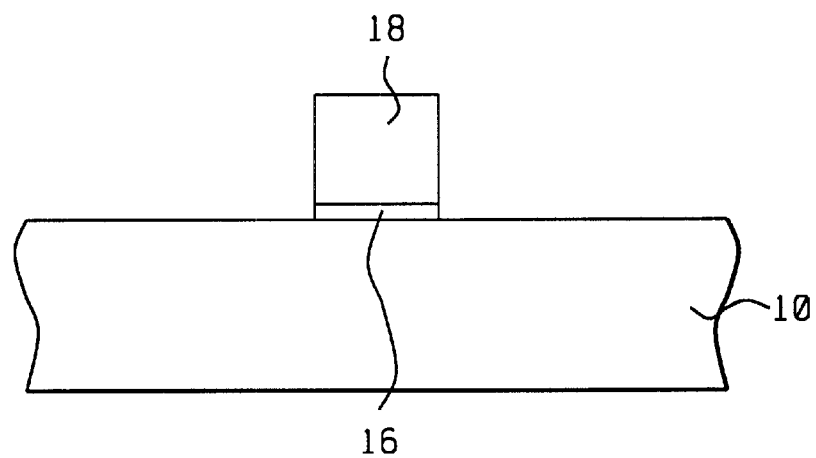
FIGS. 1–11 illustrate the steps that would be used in forming a semiconductor circuit element, in this example a MOS type transistor, in accordance with the methods and objects of this invention.

The preferred embodiment will be described by reference to the process steps, in accord with the methods and objects of the present invention, depicted schematically in FIG. 1 through FIG. 11. Referring first to FIG. 1, there is shown a schematic cross-sectional view of the initial stages of the fabrication of a MOS (metal-oxide-semiconductor) type transistor in accord with the methods of the present art. The gate electrode (18) has been patterned and formed, also by methods known to practitioners of the present art, on a gate oxide (16), which has been formed on a silicon substrate (10). The gate oxide layer (16) preferably comprises silicon dioxide that may be formed by thermal oxidation or chemical vapor deposition (CVD) to a thickness of between about 10 angstroms and 150 angstroms. The gate electrode (18) preferably comprises polysilicon that is deposited using, for example, low pressure chemical vapor deposition (LPCVD). The polysilicon layer (18) is deposited to a thickness of between about 500 angstroms and 2500 angstroms.

Figure 2:
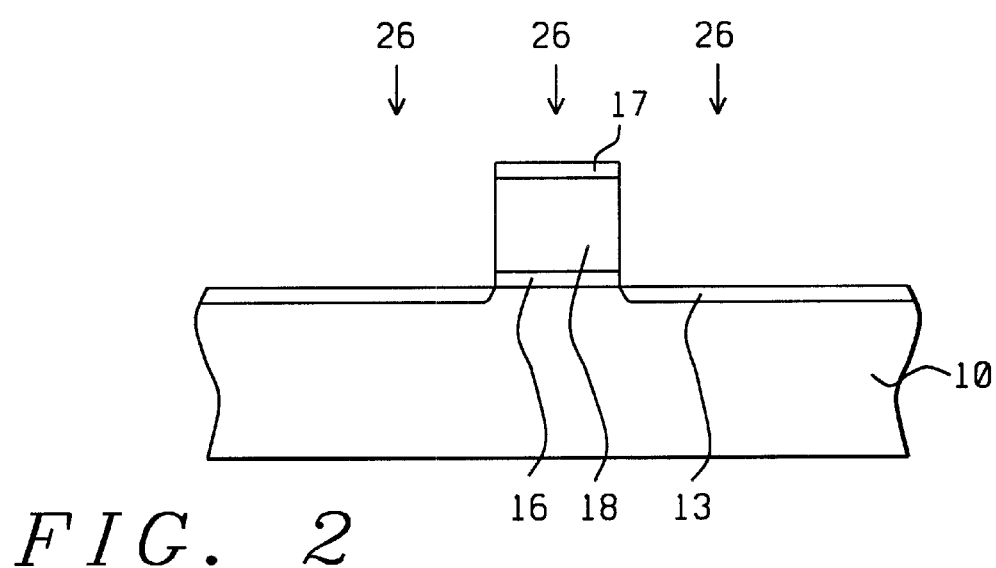

Referring next to FIG. 2, there is shown, now in accord with the methods and objects of the present invention, an ion implantation (26) of selected ions into the exposed silicon substrate (10) to form lightly doped junctions (13) in said substrate. The same ion implantation (26) also forms lightly doped junctions (17) in the exposed polysilicon layer (18). Preferably, the ion implantation (26) consists of $B^+$, $BF_2^+$, $As^+$ or $P^+$ ions, implanted at an energy of between about 0.1 KeV and 10 KeV and a dosage of between about $5 \times 10^{14}$ atoms/cm$^2$ and $10^{16}$ atoms/cm$^2$.

Figure 3:
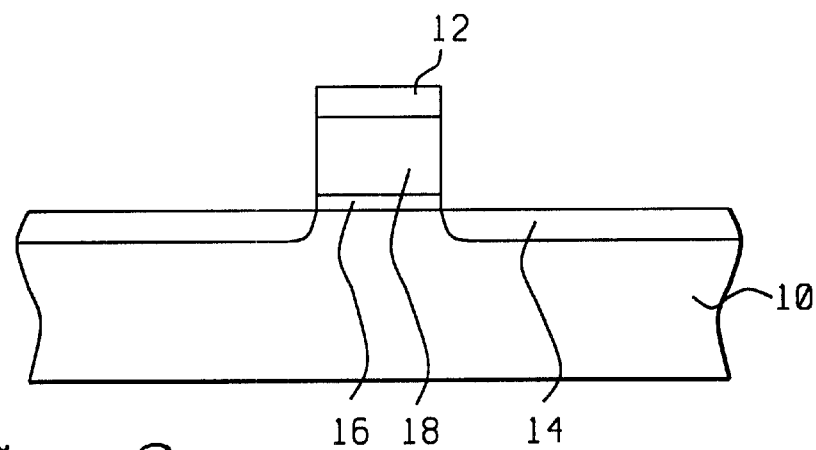

Referring next to FIG. 3, there is shown the fabrication of FIG. 2 subsequent to an annealing process to activate the dopants and to remove any damage caused by the ion implantation (26). The annealing process can be a rapid thermal anneal (RTA) or a laser annealing process. The implanted ions in the lightly doped junctions (13) diffuse into the silicon substrate (10) to form the shallow source and drain extensions (14). In addition, the implanted ions in the lightly doped junction (17) diffuse into the polysilicon layer (18) to form a lightly doped junction (12) in the polysilicon layer (18) of the gate. The shallow source and drain extensions (14) so formed have a depth of between about 60 angstroms and 500 angstroms.

Figure 4:
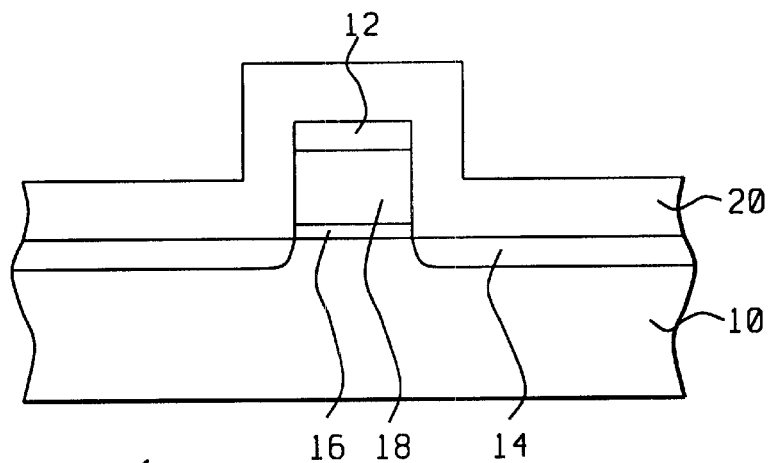

Referring now to FIG. 4, there is shown the fabrication of FIG. 3 over which a dielectric layer (20) has been deposited. The dielectric layer (20) preferably comprises silicon dioxide or silicon nitride that may be formed by a method of chemical vapor deposition (CVD). The dielectric layer (20) is deposited to a thickness of between about 200 angstroms and 1500 angstroms.

Figure 5:
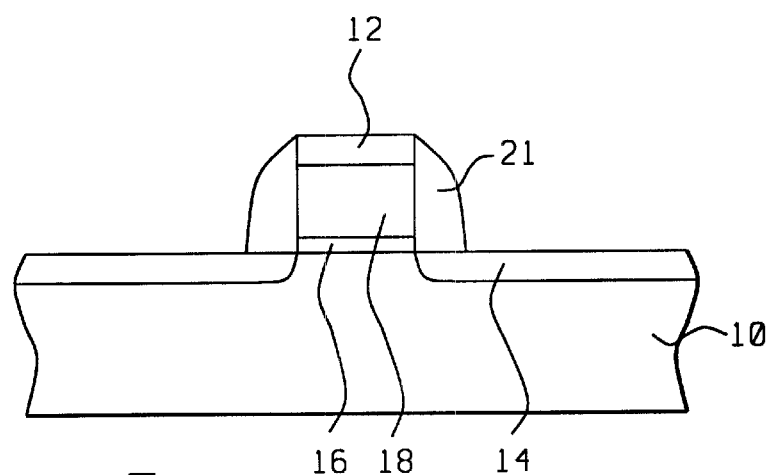

Referring next to FIG. 5, there is shown the fabrication of FIG. 4, with the dielectric layer having been anisotropically etched to form sidewall spacers (21) on the gate (18).

Figure 6:
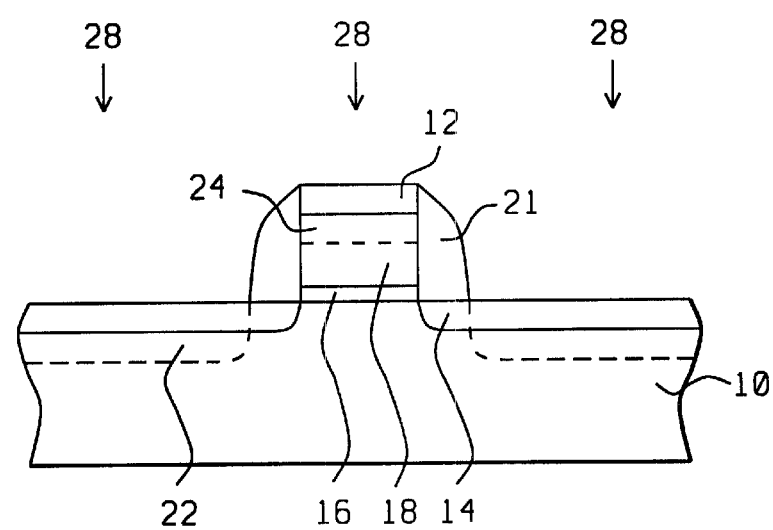

Referring now to FIG. 6, there is shown the fabrication of FIG. 5, undergoing a second ion implantation (28) of selected ions to render the surface layers of the source (22), drain (22) and gate (24) regions amorphous. Preferably said second ion implantation consists of Si, Ge or Ar ions implanted so as to break lattice bonds and create a non-crystalline or amorphous silicon layer in the silicon substrate (10). The ions of said second ion implantation are typically implanted at an energy of between about 5 KeV and 50 KeV and a dosage of between about $10^{15}$ ions/cm$^2$ and $10^{16}$ ions/cm$^2$ so as to render the surface amorphous/damaged to a depth of between about 300 angstroms and 1000 angstroms.

Figure 7:
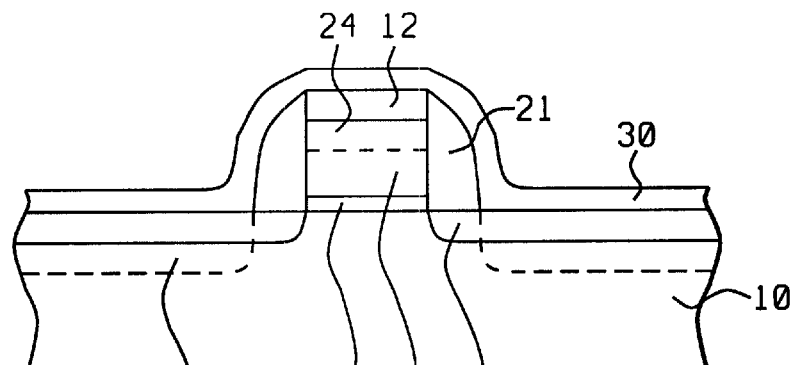

Referring next to FIG. 7, there is shown the fabrication of FIG. 6 over which has now been formed a metal layer (30) covering at least the amorphous regions, which can be a layer of titanium (Ti), cobalt (Co) or nickel-platinum (NiPt), formed to an optimal thickness which is a function of the desired silicide depth. The metal layer can be formed by a deposition process such as sputtering, evaporation or chemical vapor deposition (CVD), to a thickness of between about 50 angstroms and 450 angstroms.

Figure 8:
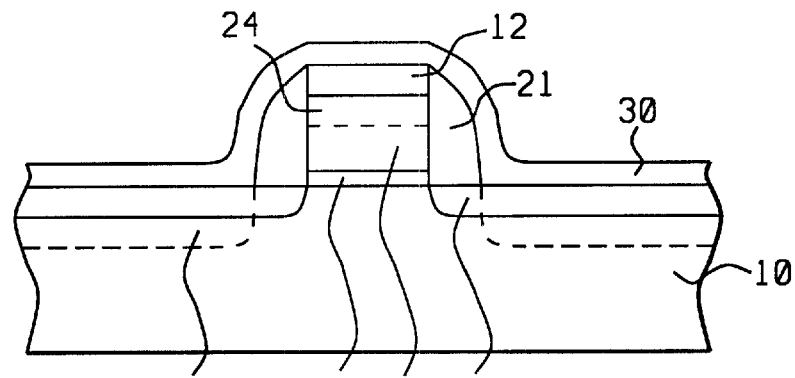

Referring next to FIG. 8, there is shown the fabrication of FIG. 7 undergoing an ion implantation process (34), said process being preferably a high-dose, high-energy, ion implantation through metal (ITM) scheme. In this scheme, preferably $B^+$, $BF_2^+$, $As^+$ or $P^+$ ions are implanted at an energy of between about 10 KeV and 250 KeV at a dosage of between about $5 \times 10^{15}$ ions/cm$^2$ and $10^{17}$ ions/cm$^2$. The ITM process serves to ion-mix the metal-Si interface to promote silicide formation.

Figure 9:
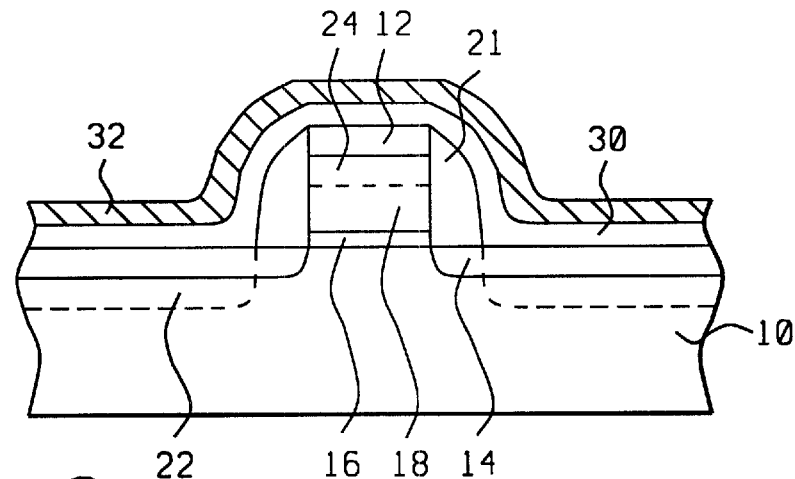

Referring now to FIG. 9, there is shown the fabrication of FIG. 8, over which a capping layer (32) has been deposited on the metal layer (30). The capping layer (32) is a layer formed of a metal/ceramic stack comprising materials chosen from a group listed, together with their melting points, in the table below. The appropriate choice of the stack material is determined by the desired process margin during subsequent laser annealing.

Table of Capping Materials

| Material | Melting Point (° C.) |
| --- | --- |
| W | 3410 |
| Ta | 2996 |
| TiN | 2930 |
| TaN | 3087 |
| $Si_3N_4$ | 1900 |
| $SiO_2$ | 1700 (approx.) |

Since the capping layer does not melt during said annealing, it protects the surface of the metal layer beneath it by acting as a barrier between said metal layer and the ambient atmosphere. The use of the capping layer is a novel and important part of the present invention. It plays two roles: 1. it protects the metal layer during laser annealing, thereby insuring a high quality silicide with good interfacial characteristics; 2. it permits a more careful regulation of the energy deposition produced by the laser annealing process, thereby assuring precise depth control of the underlying junction.

Figure 10:
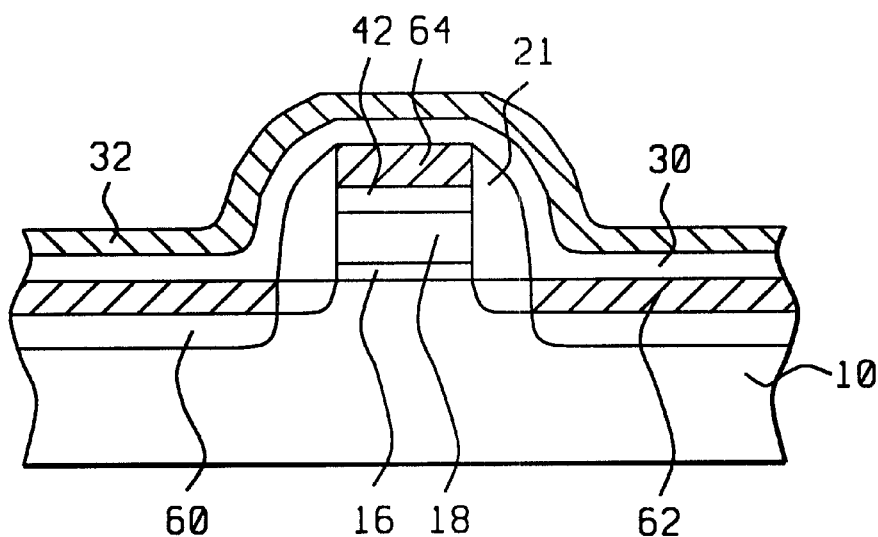

Referring next to FIG. 10, there is shown the fabrication of FIG. 9, now undergoing annealing by laser irradiation (36) of selected wavelength and fluence (energy flux). This irradiation causes the silicon in the amorphous region ((22) in FIG. 9) of the silicon substrate (10) and the amorphous region ((24) in FIG. 9) in the polysilicon layer (18) to melt. The implanted ions of the second ion implantation ((34) in FIG. 8) diffuse into the amorphous regions (22) and (24) to form deep source and drain junctions (60) in the silicon substrate (10) and in the heavily doped junction (42) in the gate. The wavelength of the laser irradiation (36) is preferably in the range of between about 157 nanometers to about 308 nanometers. The fluence of the laser irradiation (36) is preferably controlled to between about 0.1 Joules/cm$^2$ and about 1.5 Joules/cm$^2$. The metal layer (30) is heated or even melted during laser irradiation, depending upon the laser fluence. The metal layer (30) reacts with the silicon in contact with it to form silicides. A silicide layer (62) is formed in the deep source and drain regions (60) and a silicide layer (62) is formed in the polysilicon layer (18) of the gate. Because no silicide is formed on the sidewall spacers (21), the silicide layers (62) and (64) become self-aligned to transistor source, drain and gate. The laser irradiation (36) fluence is carefully chosen so that the temperature of the silicon only rises sufficiently to melt the amorphous region (22) in the silicon and the amorphous region in the gate (24). The crystalline silicon in the substrate (10) and beneath the amorphous region (22) does not melt. The dopant diffusion is, therefore, limited to the previously defined amorphous region (22). During the laser irradiation, dopant atoms are distributed almost instantaneously to the melt front. At the same time, the Si atoms and metal atoms are reacting at the metal-Si interface. The amorphous Si layer then recrystallizes from the underlying substrate at a high re-growth velocity such that the metal atoms do not diffuse through the entire depth of the melt. In this way, shallow junctions and silicides can be formed simultaneously. Hence the shallow junction will not be completely consumed by the silicide formation.

The silicon body is then subjected to a heat treatment to convert the silicided region into a highly crystalline silicide with a desired resistivity value. The heat treatment can either be a rapid thermal anneal (RTA) with appropriate temperature and duration or subsequent multiple laser pulses with low fluence. For RTA, an appropriate temperature range is between about 250° C. and 900° C. and an appropriate duration range is between about 5 sec. and 1 hour. For heat treatment using multiple laser pulses, fluence should be in the range of between about 0.05 J/cm$^2$ and 0.5 J/cm$^2$, and the number of pulses applied should range between 1 and 100.

Figure 11:
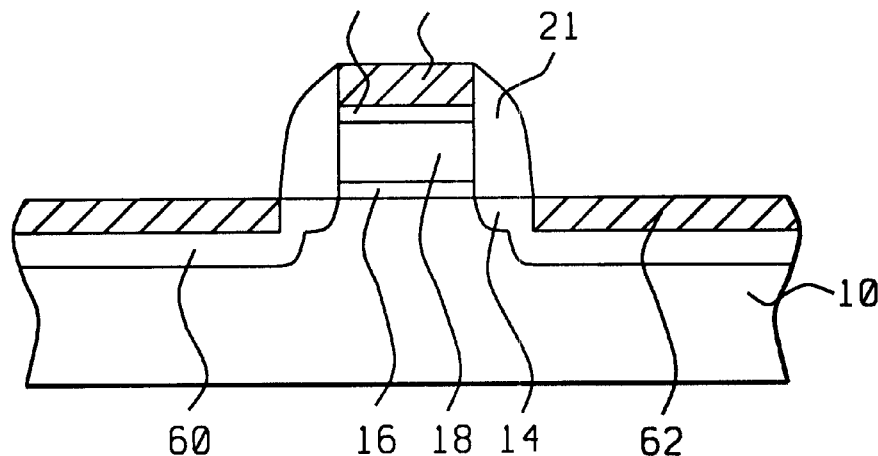

Referring finally to FIG. 11, there is seen the completed fabrication subsequent to removal of the capping layer (32) and the unreacted metal layer (30) by conventional methods. Conventional techniques are then employed to complete the manufacture of the transistor.

As is understood by a person skilled in the art, the preferred embodiment of the present invention is illustrative of the present invention rather than being limiting of the present invention. Revisions and modifications may be made to methods, processes, materials, structures, and dimensions through which are formed silicided shallow junctions in semiconductor integrated microelectronics devices, while still providing silicided shallow junctions in semiconductor integrated microelectronics devices formed in accord with the present invention as defined by the appended claims.

What is claimed is:

1. A MOSFET device having shallow silicided junctions formed through use of implant-through metal technology and laser annealing, comprising:

a gate stack provided with sidewall spacers;

a shallow, silicided, heavily doped junction on the gate stack, said silicide having desireable interfacial and electrical properties and said suicides being formed by a third, high dose ion implantation and by a subsequent laser annealing process;

deep source and drain regions having lightly doped, shallow, silicided junctions, said silicides having desireable interfacial and electrical properties and said deep source and drain regions having been doped and rendered amorphous by a sequence comprising a first and a second ion implantation.

2. The device of claim 1 wherein the gate stack is formed of silicon dioxide and the sidewall spacers are formed of silicon dioxide or silicon nitride.

3. The device of claim 1 wherein the gate stack, source and drain junctions are formed by a first ion implantation consisting of $B^+$, $BF_2^+$, $As^+$ or $P^+$ ions, implanted at an energy of between about 0.1 KeV and 10 KeV and a dosage of between about $5 \times 10^{14}$ atoms/cm$^2$ and $10^{16}$ atoms/cm$^2$.

4. The device of claim 1 wherein the gate, source and drain regions were rendered amorphous to depths of approximately 300 angstroms to 1000 angstroms by a second implantation of ions selected from a group consisting of $Si^+$, $Ge^+$, or $Ar^+$ ions, which were deposited with energy of between about 5 KeV and 50 KeV and density of between about $10^{15}$ ions/cm$^2$ and $10^{16}$ ions/cm$^2$.

5. The device of claim 1 wherein the shallow silicided junctions were formed by a third high dose ion implantation through a layer formed of a metal selected from the group consisting of Ti, Co, NiPt or Ni, and wherein said third implantation of ions through the metal layer was a high-dose, high-energy ion implantation of ions chosen from among the group $B^+$, $BF_2^+$, $As^+$ or $P^+$, implanted at an energy of between about 10 KeV and 250 KeV and at a dosage of between about $5\times10^{15}$ ions/cm$^2$ and $10^{17}$ ions/cm$^2$.

6. The device of claim 1 wherein the metal layer was then covered by a capping layer formed of an optimally chosen combination of materials selected from among the group consisting of W, Ta, TiN, TaN, $Si_3N_4$, or $SiO_2$ and the entire fabrication was heated by an RTA process or a process of laser annealing so as to melt the amorphous silicon regions beneath the metal layer and allow the recrystallization of a highly crystalline silicide with a desired resistivity value which does not consume the shallow junction.

* * * * *